United States Patent
Attimont et al.

[11] Patent Number: 5,977,833
[45] Date of Patent: Nov. 2, 1999

[54] POWER SUPPLY CIRCUIT FOR A POWER AMPLIFIER OF A MOBILE RADIO COMMUNICATION TERMINAL

[75] Inventors: Luc Attimont, Le Port Marly; Emile Sarrazin, St Brice S/ Foret, both of France

[73] Assignee: Alcatel, Paris, France

[21] Appl. No.: 08/998,807

[22] Filed: Dec. 29, 1997

[30] Foreign Application Priority Data

Dec. 30, 1996 [FR] France .................................. 96 16193

[51] Int. Cl.⁶ .............................. H03F 3/04; H03G 3/20; H01Q 11/12
[52] U.S. Cl. ........................ 330/297; 330/141; 455/127
[58] Field of Search .................................... 330/127, 128, 330/129, 279, 285, 297, 141, 281; 455/127

[56] References Cited

U.S. PATENT DOCUMENTS

| | | | |
|---|---|---|---|
| 4,523,155 | 6/1985 | Walczak et al. | 330/279 |
| 4,636,741 | 1/1987 | Mitzlaff | 330/127 |
| 5,126,688 | 6/1992 | Nakanishi et al. | |

FOREIGN PATENT DOCUMENTS

0110355A2  6/1984  European Pat. Off. .
0626765A1  11/1994  European Pat. Off. .

Primary Examiner—Robert Pascal
Assistant Examiner—Patricia T. Nguyen
Attorney, Agent, or Firm—Sughrue, Mion, Zinn, Macpeak & Seas, PLLC

[57] ABSTRACT

A power supply circuit for a power amplifier of a mobile radio communication terminal, the power amplifier being suitable for delivering transmitter power that can present variations that are relatively fast and variations that are relatively slow, the power supply circuit essentially comprising:

an active three-pole power device for controlling said power amplifier, the device receiving both a control voltage that is a function of said relatively fast variation and an active three-pole device power supply voltage, and delivering to said power amplifier a given power supply current at a given voltage referred to as the power supply voltage for said power amplifier; and means for generating the power supply voltage for said active three-pole device, and suitable for delivering to said active three-pole device a power supply voltage that is variable in such a manner that for a given value of said transmission power that is subject to relatively slow variations, the voltage drop across the terminals of said active three-pole device is minimal.

7 Claims, 2 Drawing Sheets

POWER SUPPLY CIRCUIT FOR A POWER AMPLIFIER OF A MOBILE RADIO COMMUNICATION TERMINAL

The present invention relates in general to mobile radio communication terminals, and more particularly to powering the power amplifiers provided in such terminals, in order to control the power transmitted.

BACKGROUND OF THE INVENTION

In a cellular mobile radio communication system, it is known to control transmitted power as a function of a power reference coming from the system itself, and in particular as a function of the distance of a mobile from an element of the infrastructure, also referred to as a base station, with which the mobile is in communication, for the purpose of reducing the overall level of interference in the system.

In a digital mobile radio communication system using the time division multiple access (TDMA) technique, it is also known to control the transmitted power as a function of the waveform of the signal to be transmitted. More precisely, since the information to be transmitted is put into the form of packets or "bursts", for transmission during predetermined time intervals in a frame structure, the waveform has a level corresponding to the working portion of the packet, preceded by a rising slope and followed by a falling slope, the two slopes corresponding to guard times on either side of the working portion.

In order to power a power amplifier in such a manner as to perform such control over transmitted power, it is known to provide an active three-pole power device for controlling said power amplifier, the active three-pole device receiving not only a control voltage as a function of the power to be transmitted, but also a power supply voltage for the active three-pole device, and delivering power supply current to the power amplifier at a given power supply voltage for said power amplifier. Said power supply voltage for the active three-pole device is also generally fixed and thus set, in practice, as a function of the maximum power that is to be transmitted.

The main drawback of such a circuit is poor efficiency at low transmitter power since the product of said power supply current multiplied by the voltage drop across the terminals of the active three-pole device can then rise to relatively high values.

To avoid that drawback, and in the context of an analog mobile radio communication system, it is known from document EP 0 626 765 to supply said power supply current and said amplifier power supply voltage via a voltage converter, itself including a controlling active three-pole device which is controlled as a function of the power to be transmitted, but which does not itself deliver said power amplifier power supply voltage and current in full, but delivers only that portion of said power supply voltage and current which varies as a function of the demanded transmitter power.

Such a solution is unsuitable for digital mobile radio communication systems of the kind outlined above, or more generally for any system in which transmitter power is likely to vary relatively quickly, i.e. too quickly relative to the reaction times necessary for such a voltage converter, due to the presence therein of components such as inductors and capacitors having relatively long time constants. To give an order of magnitude, in the mobile radio communication system known under the abbreviation GSM (for "Global System, for Mobile Communication"), the signals transmitted are liable to vary during said rising and falling slopes, by 70 dB over a time interval of about 30 microseconds.

OBJECTS AND SUMMARY OF THE INVENTION

A particular object of the present invention is to enable efficiency to be improved at low transmitter powers, while also being applicable to such systems in which the power to be transmitted is liable to vary relatively quickly.

The present invention thus provides a power supply circuit for a power amplifier of a mobile radio communication terminal, the power amplifier being suitable for delivering transmitter power that can present variations that are relatively fast and variations that are relatively slow, the power supply circuit comprising:

an active three-pole power device for controlling said power amplifier, the device receiving both a control voltage that is a function of said relatively fast variations, and an active three-pole device power supply voltage, and delivering to said power amplifier a given power supply current at a given voltage referred to as the power supply voltage for said power amplifier; and means for generating the power supply voltage for said active three-pole device, and suitable for delivering to said active three-pole device a power supply voltage that is variable in such a manner that for a given value of said transmission power that is subject to relatively slow variations, the voltage drop across the terminals of said active three-pole device is minimal.

BRIEF DESCRIPTION OF THE DRAWINGS

Other objects and characteristics of the present invention appear on reading the following description of embodiments, given with reference to the accompanying drawings, in which.

MORE DETAILED DESCRIPTION

Figure 1:
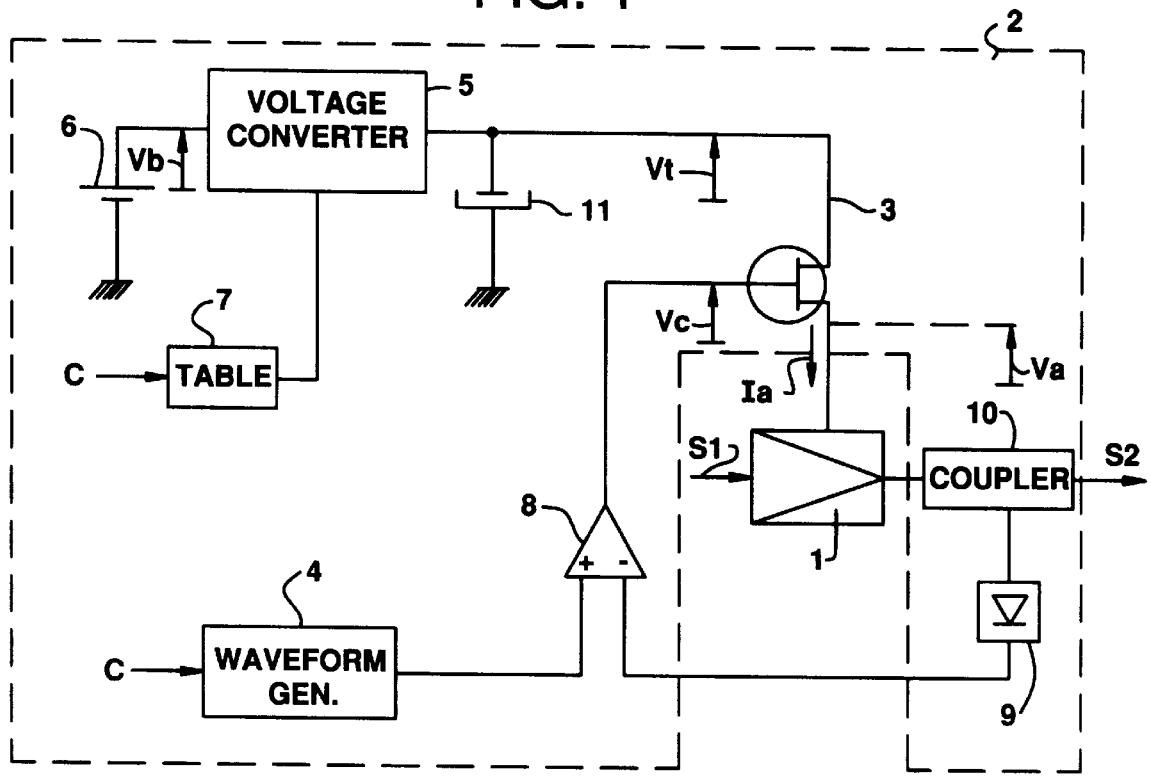
FIG. 1 is a circuit diagram for showing a first embodiment of a power supply circuit of the invention.

FIG. 1 shows a power amplifier 1 for a mobile radio communication terminal. The power amplifier receives a signal to be amplified S1 representing information to be transmitted, and it is powered by a power supply circuit 2 for controlling the power at which the corresponding amplified signal S2 is transmitted.

The mobile radio communication system under consideration is a digital system using the time division multiple access technique. Said information to be transmitted is thus put into the form of packets or "bursts" that are to be transmitted at predetermined time intervals in a frame structure, and the power at which the signal bearing the information is transmitted is thus liable to vary rather quickly, as explained above.

The mobile radio communication system under consideration is also a cellular system, in which case the transmitter power is also liable to vary more slowly, in response to said power being under the control of the mobile radio communication system itself for the purpose of reducing the overall level of interference in the system, as outlined above.

The power supply circuit 2 for the power amplifier 1 includes an active three-pole power device 3 for controlling said power amplifier, said active three-pole device receiving both a control voltage Vc which is a function of the power to be transmitted and a power supply voltage Vt, referred to as the power supply voltage of the active three-pole device, and it delivers to said power amplifier a given power supply current Ia at a given voltage Va referred to as the power supply voltage of the power amplifier.

The active three-pole device 3 can be constituted by any electronic power component, such as a bipolar transistor or a field effect transistor, for example.

The control voltage Vc applied to the active three-pole device 3 is delivered by a control voltage generator 4 suitable for generating various control voltage waveforms corresponding to various types of packet that are transmitted in the system under consideration (by way of example, in the GSM system, such packets include access packets known under the abbreviation "RACCH" (for: "Random Access Control Channel") or traffic packets known under the initials "TCH" (for: "Traffic Channel")), and for each type of packet the control voltage waveforms also correspond to various transmitter power reference levels received from the system, with the generator 4 receiving an external control signal C enabling one or other of the various possible control voltages to be selected.

The power supply circuit 2 also includes means 5 for generating a power supply voltage for said active three-pole device, and suitable for delivering a power supply voltage Vt that varies in such a manner that, for a given reference transmitter power level received from the system, the voltage drop Vt-Va across the terminals of said active three-pole device is very small.

Thus, although the active three-pole device 3 does indeed deliver all of the current and voltage powering the power amplifier 1, efficiency at low transmitter power levels is better than in the above-mentioned prior art, while still having a power supply circuit that enables transmission power to be varied relatively fast.

To prevent the active three-pole device 3 operating under saturation conditions, since that would deform the transmitted signal, it is also preferable for the power supply voltage Vt supplied by the means 5 to be such that the voltage drop Vt-Va across the terminals of the active three-pole device remains greater than a minimum threshold.

In the example shown in FIG. 1, the means 5 comprise a voltage converter controlled to deliver a variable voltage Vt from a fixed voltage Vb supplied by a battery 6, with the voltage Vt varying in such a manner that for a given transmission power, the voltage drop Vt-Va across the terminals of the active three-pole device 3 is very small.

Such controllable voltage converters are known and are therefore not described again herein. The control signal for such a converter can be taken, for example, from a correspondence or lookup table 7 whose contents can be determined experimentally, for example. In the example shown in FIG. 1, such a correspondence table is addressed by an external control signal, which may be the same as the signal C received by the generator 4.

The two possible causes of variation in transmission power (relatively slow variations and relatively fast variations) are thus decoupled from each other, and since the voltage converter is controlled only as a function of the remoteness of the mobile station (corresponding to said relatively slow variations), the problem of such a converter not being fast enough for a system that operates in "bursts" (corresponding to said relatively fast variations) does not arise.

To eliminate the various possible causes (in particular temperature, component aging, . . . etc.) that can cause the power transmitted in practice not to be exactly the same as the power expected given a particular control voltage, provision is also made for said transmitted power to be servo-controlled to the power that corresponds to the control voltage, with said servo-control being provided by means of a differential amplifier 8 that receives both the control voltage from the generator 4 and a voltage representative of the power actually transmitted, obtained from a detector 9 operating on a fraction of the transmitted power taken by means of a coupler 10.

To limit current demand on the means 5 for generating the power supply voltage of the active three-pole device during rapid variations in waveform corresponding to the signals to be transmitted, it is also advantageous to provide in parallel with said generator means 5, a capacitor 11 which acts as a tank capacitor.

The power supply circuit shown in FIG. 2 differs from that shown in FIG. 1 only by the fact that its correspondence or lookup table, now referenced 12, is addressed by the real power supply voltage Va of the power amplifier, with the content of said table being determined, e.g. experimentally, so as to adjust the voltage Vt delivered by the means 5 so that the difference Vt-Va between the two voltages remains below a predetermined threshold value. The value for the power supply voltage Va of the power amplifier is given by a peak voltage detector 13 connected to the power input of the power amplifier 1.

Figure 2:
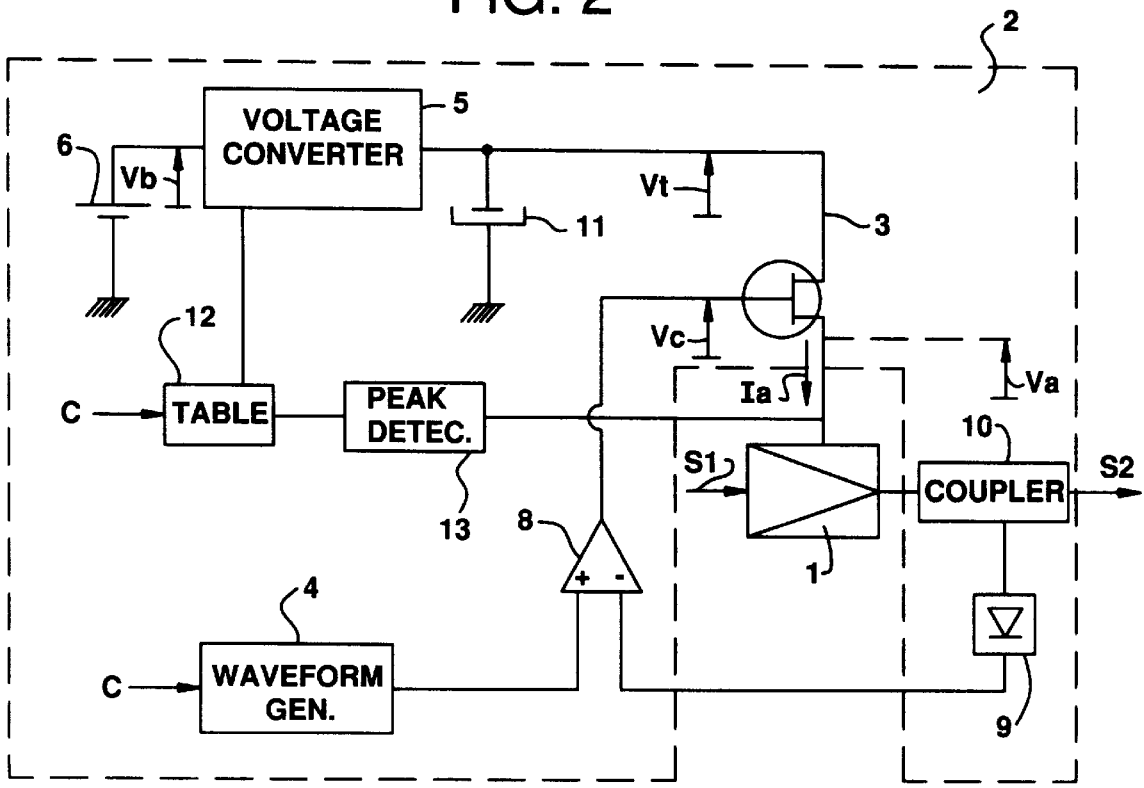
FIG. 2 is a circuit diagram for showing a second embodiment of a power supply circuit of the invention.

In addition and as shown in FIG. 2, since such control is intended more specifically to operate under steady conditions, control by means of said external reference C can continue to be applied so as to enable such a system to converge more quickly on the desired value during an initialization stage preceding such steady operation. The contents of said correspondence table is then determined, e.g. experimentally, to enable said table to be addressed under such circumstances both by the external reference and by the detected value Va of the power supply voltage.

Figure 3:
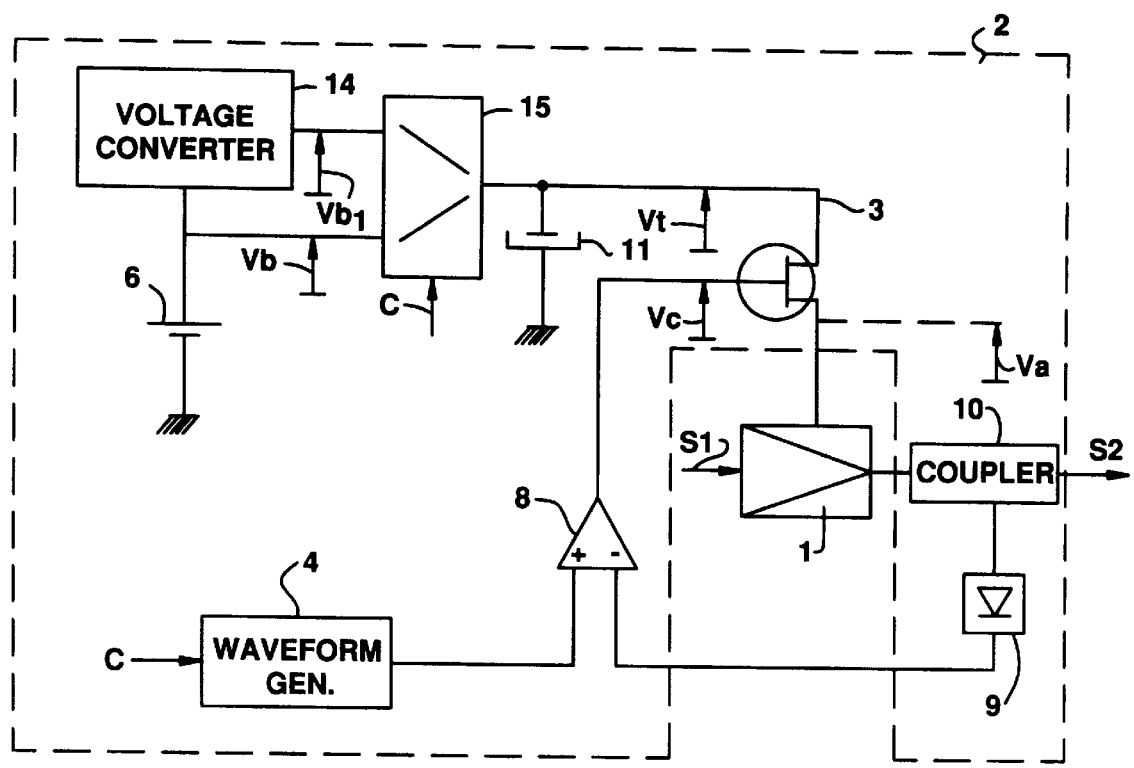
FIG. 3 is a circuit diagram for showing a third embodiment of a power supply circuit of the invention.

The power supply circuit shown in FIG. 3 differs from that in FIG. 1 only in the way in which the means 5 are implemented, and in this case they comprise a voltage converter 14 delivering a voltage Vb1 from the fixed voltage Vb delivered by the battery 6, with the voltage Vb1 being different from Vb, and a switch 15 that receives both the voltage Vb delivered by the battery 6 and the voltage Vb1 from the voltage converter 14, and which selects one or other of these voltages as a function of the demanded transmission power as represented by the signal C.

Although this circuit provides lower performance than the preceding circuit (since the voltage Vt can only take two possible values) it nevertheless has the advantage of being simpler to implement, particularly since less modification needs to be provided to a conventional power supply circuit in order to make it comply with the present invention compared with that required for the circuit shown in FIG. 1, since in this case it suffices to provide a switch such as the switch 15, given that a non-controllable converter such as the converter 14 is generally already provided in a mobile radio communication terminal to deliver a voltage such as Vb1 from a voltage such as the voltage Vb used for powering circuits other than the power circuits, where the voltage such as Vb1 is greater than Vb and is used for powering the power circuits.

We claim:

1. A power supply circuit for a power amplifier of a mobile radio communication terminal, the power amplifier being suitable for delivering transmitter power that can present variations that are relatively fast and variations that are relatively slow, the power supply circuit comprising:

an active three-pole power device for controlling said power amplifier, the device receiving both a control voltage that is a function of said relatively fast variation and an active three-pole device power supply voltage, and delivering to said power amplifier a given power supply current at a given voltage referred to as the power supply voltage for said power amplifier; and means for generating the power supply voltage for said active three-pole device, and supplying to said active three-pole device a power supply voltage that is variable in such a manner that for a given value of said transmission power that is subject to relatively slow variations, the voltage drop across the terminals of said active three-pole device is minimal.

2. A circuit according to claim 1, wherein said means for generating the power supply voltage for said active three-pole device are controlled by a signal from a look-up table addressed by an external reference for transmission power.

3. A circuit according to claim 1, wherein said means for generating the power supply voltage for said active three-pole device are controlled by a signal from a look-up table addressed by a signal representative of the power supply voltage of the power amplifier.

4. A circuit according to claim 1, wherein said means for generating the power supply voltage for said active three-pole device are controlled by a signal from a look-up table addressed by an external reference for transmission power and by a signal representative of the power supply voltage of the power amplifier.

5. A circuit according to claim 1, wherein said means for generating the power supply voltage for said active three-pole device comprise a voltage converter delivering a variable power supply voltage derived from a fixed voltage.

6. A circuit according to claim 1, wherein said means for generating the power supply voltage for said active three-pole device comprise a voltage converter delivering, from a first fixed voltage, a second fixed voltage of different value, and a switch controlled to select one or other of said first and second fixed voltages, in such a manner that for given transmission power, the voltage drop across the terminals of said active three-pole device is minimal.

7. A device according to claim 1, further including a tank-capacitor in parallel with the output of said means for generating the power supply voltage of said active three-pole device.

* * * * *